US012590385B2

(12) United States Patent (10) Patent No.: US 12,590,385 B2
Umeta et al. (45) **Date of Patent: \*Mar. 31, 2026**

(54) SiC EPITAXIAL WAFER

(71) Applicant: Resonac Corporation, Tokyo (JP)

(72) Inventors: Yoshikazu Umeta, Tokyo (JP); Marie Ohuchi, Tokyo (JP)

(73) Assignee: Resonac Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/938,677

(22) Filed: Nov. 6, 2024

(65) Prior Publication Data

US 2025/0146175 A1 May 8, 2025

(30) Foreign Application Priority Data

Nov. 7, 2023 (JP) ................................. 2023-190370
Nov. 5, 2024 (JP) ................................. 2024-193743

(51) Int. Cl.
*B32B 3/00* (2006.01)
*C30B 25/20* (2006.01)
*C30B 29/36* (2006.01)

(52) U.S. Cl.
CPC ................ *C30B 25/20* (2013.01); *B32B 3/00* (2013.01); *C30B 29/36* (2013.01)

(58) Field of Classification Search
CPC ...................................................... C30B 29/36
See application file for complete search history.

(56) References Cited

U.S. PATENT DOCUMENTS

| | | | |
|---|---|---|---|
| 10,176,987 B2 | 1/2019 | Miyasaka et al. | |
| 10,801,128 B2 * | 10/2020 | Motoyama | C23C 16/325 |
| 11,326,275 B2 * | 5/2022 | Umeta | C30B 25/14 |
| 2012/0061687 A1 | 3/2012 | Harada et al. | |
| 2019/0187068 A1 | 6/2019 | Guo et al. | |
| 2019/0376206 A1 | 12/2019 | Fukada et al. | |
| 2020/0066847 A1 | 2/2020 | Mitani et al. | |
| 2020/0251561 A1 | 8/2020 | Nishihara et al. | |
| 2022/0173001 A1 | 6/2022 | Ishibashi et al. | |
| 2023/0392288 A1 | 12/2023 | Yamaguchi et al. | |
| 2024/0093405 A1 * | 3/2024 | Tanaka | H01L 21/0257 |
| 2025/0059679 A1 | 2/2025 | Katada et al. | |
| 2025/0146174 A1 * | 5/2025 | Umeta | C30B 29/36 |

(Continued)

FOREIGN PATENT DOCUMENTS

| | | |
|---|---|---|
| CN | 109628999 A | 4/2019 |
| JP | 2016-102061 A | 6/2016 |

(Continued)

OTHER PUBLICATIONS

Communication dated Jul. 15, 2025 from the United States Patent and Trademark Office in U.S. Appl. No. 18/938,549.

(Continued)

*Primary Examiner* — Elizabeth E Mulvaney
(74) *Attorney, Agent, or Firm* — Sughrue Mion, PLLC

(57) ABSTRACT

An objective of the present invention is to provide a SiC epitaxial wafer with a large diameter, a thin thickness, and high carrier concentration uniformity. A SiC epitaxial wafer includes a SiC substrate and a SiC epitaxial layer. The SiC substrate has a diameter of 195 mm or more and a thickness of 460 μm or less. The SiC epitaxial layer has a carrier concentration variation of 20% or less.

9 Claims, 5 Drawing Sheets

(56)                     References Cited

U.S. PATENT DOCUMENTS

2025/0146178  A1*    5/2025  Umeta ................... C30B 29/64
2025/0218771  A1      7/2025  Hisanabe et al.

FOREIGN PATENT DOCUMENTS

| JP | 2017-084989  A | 5/2017 |
| JP | 2017-145150  A | 8/2017 |
| JP | 2018-107398  A | 7/2018 |
| JP | 2018-113303  A | 7/2018 |
| JP | 2019-096764  A | 6/2019 |
| JP | 6969628  B2 | 11/2021 |
| KR | 10-2012-0014024  A | 2/2012 |

OTHER PUBLICATIONS

Lei, et al., "A fantastic two-dimensional $MoS_2$ material based on the inert basal planes activation: Electronic structure, synthesis strategies, catalytic active sites, catalytic and electronics properties", Coordination Chemistry Reviews, Sep. 4, 2019, vol. 399, No. 213020, pp. 1-44 (44 pages).

* cited by examiner

SiC EPITAXIAL WAFER

BACKGROUND OF THE INVENTION

Field of the Invention

The present invention relates to a SiC epitaxial wafer.

Priority is claimed on Japanese Patent Application No. 2023-190370, filed Nov. 7, 2023, and Japanese Patent Application No. 2024-193743, filed Nov. 5, 2024, the content of which is incorporated herein by reference.

Description of Related Art

Silicon carbide (SiC) has a dielectric breakdown field that is ten times larger than that of silicon (Si) and has a band gap that is three times larger than that of silicon (Si). Moreover, silicon carbide (SiC) has a characteristic such as thermal conductivity that is three times higher than that of silicon (Si). For this reason, silicon carbide (SiC) is expected to be applied to power devices, high-frequency devices, high-temperature operation devices, and the like. Thus, in recent years, SiC epitaxial wafers have been used for the semiconductor devices as described above.

SiC epitaxial wafers are obtained by stacking a SiC epitaxial layer on the surface of a SiC substrate. Hereinafter, a substrate before the SiC epitaxial layer is stacked will be referred to as a SiC substrate, and a substrate after the SiC epitaxial layer is stacked will be referred to as a SiC epitaxial wafer. The SiC substrate is produced by cutting out the SiC substrate from the SiC ingot. SiC devices such as a power device, a high-frequency device, and a high-temperature operating device are obtained by forming a device on the SiC epitaxial layer of the SiC epitaxial wafer and then chipping the SiC epitaxial wafer.

One index for evaluating SiC epitaxial wafers is a carrier concentration. To increase the uniformity of chips acquired from one SiC epitaxial wafer, the carrier concentration in the plane of the SiC epitaxial wafer is preferably uniform. For example, Patent Documents 1 and 2 disclose a SiC epitaxial wafer having the high uniformity of the carrier concentration in the plane. Moreover, Patent Document 3 discloses a SiC epitaxial growth device capable of increasing temperature uniformity during a manufacturing process that affects the uniformity of the carrier concentration in the plane.

PATENT DOCUMENTS

[Patent Document 1] Japanese Patent No. 6969628
[Patent Document 2] Japanese Unexamined Patent Application, First Publication No. 2017-84989
[Patent Document 3] Japanese Unexamined Patent Application, First Publication No. 2019-96764

SUMMARY OF THE INVENTION

To increase the number of SiC devices that can be acquired from a single SiC epitaxial wafer, a larger diameter of the SiC epitaxial wafer is required. However, it is not easy to increase the diameter of the SiC epitaxial wafer.

When the SiC epitaxial wafer has a large diameter, the internal stress may increase and the shape may change greatly in the manufacturing process. When the thickness of the SiC substrate increases, a change in the shape of the SiC epitaxial wafer can be suppressed, but an increase in cost and an increase in the resistance of the device are caused. On the other hand, if the thickness is simply reduced, the SiC substrate warps during the deposition of the SiC epitaxial layer and the uniformity of a carrier density of the SiC epitaxial layer decreases.

The present invention has been made in view of the above-described problems and an objective of the present invention is to provide a SiC epitaxial wafer with a large diameter, a thin thickness, and high carrier concentration uniformity.

(1) According to a first aspect, there is provided a SiC epitaxial wafer including: a SiC substrate; and a SiC epitaxial layer, wherein the SiC substrate has a diameter of 195 mm or more and a thickness of 460 μm or less, and wherein the SiC epitaxial layer has a carrier concentration variation of 20% or less.

(2) In the SiC epitaxial wafer according to the above-described aspect, a local thickness variation (LTV) in each of a plurality of unit exposure regions classified as 20 mm squares may be 4 μm or less in a planar view in a stacking direction of the SiC epitaxial wafer.

(3) In the SiC epitaxial wafer according to the above-described aspect, site flatness (site flatness, front reference surface, least-squares best-fit reference plane, range (SFQR)) in each of a plurality of unit exposure regions classified as 20 mm squares may be 2 μm or less in a planar view in a stacking direction of the SiC epitaxial wafer.

(4) In the SiC epitaxial wafer according to the above-described aspect, warp may be 90 μm or less.

(5) In the SiC epitaxial wafer according to the above-described aspect, bow may be 60 μm or less when a surface connecting a support point overlapping a circumference within 7.5 mm from an outermost circumference and an overlapping portion as seen in a thickness direction is used as a reference surface.

(6) In the SiC epitaxial wafer according to the above-described aspect, a SORI may be 60 μm or less.

(7) In the SiC epitaxial wafer according to the above-described aspect, the SiC epitaxial layer may have a carrier concentration variation of 20% or less in a first region at a distance of 60 mm or more and 95 mm or less from a center of the SiC epitaxial layer in a planar view in a stacking direction of the SiC epitaxial layer.

(8) In the SiC epitaxial wafer according to the above-described aspect, a variation in a film thickness of the SiC epitaxial layer may be 5% or less.

(9) In the SiC epitaxial wafer according to the above-described aspect, the SiC epitaxial layer may have the film thickness variation of 5% or less in a first region at a distance of 60 mm or more and 95 mm or less from a center of the SiC epitaxial layer in a planar view in a stacking direction of the SiC epitaxial layer.

According to the above-described aspects, a SiC epitaxial wafer has a large diameter, a thin thickness, and high carrier concentration uniformity.

DETAILED DESCRIPTION OF THE INVENTION

Figures 1, 2:
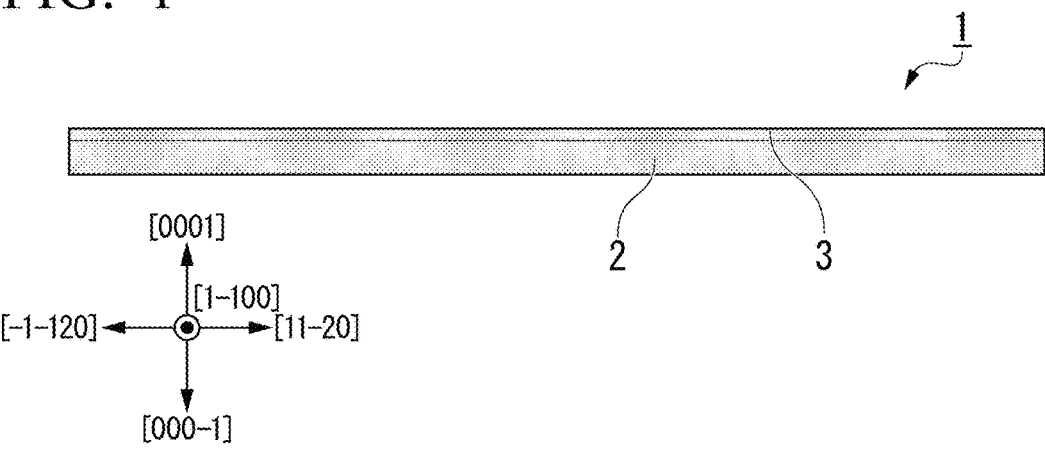
FIG. 1 is a cross-sectional view of a SiC epitaxial wafer according to the present embodiment.
FIG. 2 is a plan view of the SiC epitaxial wafer according to the present embodiment.

Hereinafter, a SiC epitaxial wafer and the like according to the present embodiments will be described in detail with reference to the drawings as appropriate. In the drawings used in the following description, featured parts may be enlarged for convenience such that the features of the present invention are easier to understand, and dimensional ratios and the like of the respective components may be different from actual ones. Materials, dimensions, and the like exemplified in the following description are examples, the present invention is not limited thereto, and modifications can be appropriately made without departing from the subject matter of the present invention.

As used herein, an individual direction is denoted by [ ] and a group direction is denoted by < >. For negative indices, a "–" (bar) placed above the number is customary in crystallography, but a negative sign is placed before the number in this specification.

FIG. 1 is a cross-sectional view of a SiC epitaxial wafer 1 according to the present embodiment. FIG. 2 is a plan view of the SiC epitaxial wafer 1 according to the present embodiment.

The SiC epitaxial wafer 1 includes a SiC substrate 2 and a SiC epitaxial layer 3. A planar shape of the SiC epitaxial wafer 1 is approximately circular. The SiC epitaxial wafer 1 may have a notch 4 for ascertaining a direction of a crystal axis. Moreover, the SiC epitaxial wafer 1 may have an orientation flat instead of the notch 4.

The SiC epitaxial wafer 1 is a wafer of 8 inches (approximately 200 mm) or more. A diameter of the SiC epitaxial wafer 1 is 195 mm or more, preferably 199 mm or more. Moreover, the diameter of the SiC epitaxial wafer 1 is preferably 205 mm or less, more preferably 201 mm or less.

The diameter of the SiC epitaxial wafer may be measured using the laser displacement meter.

The SiC substrate 2 is made of, for example, n-type SiC. A polytype of the SiC substrate 2 may be any of 2H, 3C, 4H, or 6H regardless of particular preference. The SiC substrate 2 is, for example, 4H—SiC. A diameter of the SiC substrate 2 is the same as a diameter of the SiC epitaxial wafer 1.

The thickness of the SiC substrate 2 is 460 μm or less, preferably 420 μm or less, more preferably 380 μm or less, more preferably 375 μm or less, more preferably 350 μm or less, more preferably 300 μm or less, more preferably 250 μm or less, more preferably 200 μm or less, more preferably 150 μm or less, more preferably 100 μm or less, and particularly preferably 50 μm or less. The thickness of the SiC substrate 2 may be 1 μm or more. When the thickness of the SiC substrate 2 is thin, the yield of the SiC device that can be obtained from one SiC ingot is high. Moreover, when the thickness of the SiC substrate 2 is thin, it is possible to suppress the high resistance of the SiC device.

The thickness of the SiC substrate may be measured using the laser displacement meter.

The SiC epitaxial layer 3 is stacked on one side of the SiC substrate 2. The SiC epitaxial layer 3 is made of SiC.

Moreover, in the SiC epitaxial layer according to the present embodiment, a variation in the carrier concentration is 20% or less, preferably 15% or less, more preferably 12% or less, even more preferably 10% or less, particularly preferably 5% or less, and particularly more preferably 2% or less. The variation in the carrier concentration is obtained by dividing a difference between a maximum value and a minimum value of the carrier concentration of the SiC epitaxial layer 3 measured along a straight line extending in a <11-20> direction through the center C of the SiC epitaxial layer 3 by a value obtained by multiplying the average value by 2. The carrier concentration may be measured at equal intervals from the center C on a straight line or the interval may change. The carrier concentration may be measured at 10 mm intervals, 15 mm intervals, 20 mm intervals, 25 mm intervals, or 30 mm intervals.

A lower limit value of the variation in the carrier concentration may be 0.5% or 1.5%.

For example, when the diameter of the SiC epitaxial wafer 1 is 200 mm (8 inches), the carrier concentration is measured at the center and positions of ±20 mm, ±40 mm, ±60 mm, ±80 mm, and ±95 mm from the center along a straight line L extending in the <11-20> direction with the center C as the reference. Carrier concentration uniformity is obtained from carrier concentrations at these measurement points.

Moreover, for example, when the diameter of the SiC epitaxial wafer 1 is 250 mm (10 inches), the carrier concentration is measured at the center and positions of ±25 mm, ±50 mm, ±75 mm, ±100 mm, and ±120 mm from the center along the straight line L extending in the <11-20> direction with the center C as the reference. Carrier concentration uniformity is obtained from carrier concentrations at these measurement points.

Moreover, for example, when the diameter of the SiC epitaxial wafer 1 is 300 mm (12 inches), the carrier concentration is measured at the center and positions of ±30 mm, ±60 mm, ±90 mm, ±120 mm, and ±145 mm from the center along the straight line L extending in the <11-20> direction with the center C as the reference. Carrier concentration uniformity is obtained from carrier concentrations at these measurement points.

Here, the carrier concentration is an effective carrier concentration. The effective carrier concentration is an absolute value of a difference between a donor concentration and an acceptor concentration. The carrier concentration of the SiC epitaxial layer 3 can be measured by, for example, a mercury probe (Hg—CV) method or a secondary ion mass spectrometry (SIMS) method. In the Hg—CV method, a difference between the donor concentration and the acceptor concentration is measured as the effective carrier concentration. The secondary ion mass spectrometry (SIMS) method is a method of performing ejected secondary ion mass spectrometry while scraping the layer in a thickness direction. Doping concentrations can be measured from mass spectrometry. In the secondary ion mass spectrometry (SIMS) method, it is possible to measure actual values of the donor concentration and the acceptor concentration and find the effective carrier concentration by finding a difference therebetween.

In the first region at a distance of 60 mm or more and 95 mm or less from the center of the SiC epitaxial layer 3 in the planar view in the stacking direction of the SiC epitaxial layer 3, the variation in the carrier concentration of the SiC epitaxial layer 3 is preferably 20% or less, more preferably 15% or less, even more preferably 12% or less, still more preferably 10% or less, particularly preferably 5% or less, and particularly more preferably 2% or less. The first region is located on an outer peripheral side of the SiC epitaxial wafer 1 and is a portion where the carrier concentration is likely to vary. If the variation in the portion is within the above-described range, the element variation of the SiC device after a device generation process can be further reduced. The carrier concentration in the first region, for example, is measured at points of ±60 mm, ±80 mm, and ±95 mm from the center along the straight line extending in the <11-20> direction with the center C as the reference and measured at points of ±60 mm, ±80 mm, ±95 mm, and −90 mm from the center along the straight line extending in a <−1100> direction with the center C as the reference. A point of −90 mm is arranged on the inside to avoid the notch 4. In addition, the [11-20] direction or the [−1100] direction is denoted by "+."

A lower limit value of the variation in the carrier concentration in the first region may be 0.5% or 1.5%.

Moreover, in the SiC epitaxial layer 3 according to the present embodiment, a variation in the film thickness may be 5% or less. The variation in the film thickness of the SiC epitaxial layer 3 is preferably 4% or less, more preferably 3% or less, even more preferably 2% or less, and particularly preferably 1% or less. The variation in the film formation is obtained by dividing a difference between a maximum value and a minimum value of the film formation of the SiC epitaxial layer 3 measured along a straight line extending in the <11-20> direction through the center C of the SiC epitaxial layer 3 using the infrared spectrometric method by a value obtained by twice the average value. The measurement point of the film thickness is similar to the measurement point of the carrier concentration.

A lower limit value of the variation in the film thickness of the SiC epitaxial layer may be 0.3% or 0.9%.

In the first region at a distance of 60 mm or more and 95 mm or less from the center of the SiC epitaxial layer 3 in the planar view in the stacking direction of the SiC epitaxial layer 3, the variation in the film thickness of the SiC epitaxial layer 3 is preferably 5% or less, more preferably 4% or less, even more preferably 3% or less, still more preferably 2% or less, and particularly preferably 1% or less. The first region is located on an outer peripheral side of the SiC epitaxial wafer 1 and is a portion where the film formation is likely to vary. If a variation in the portion is within the above-described range, a variation in the element of the SiC device after a device generation process can be further reduced. A measurement point of the film thickness is similar to a measurement point of the carrier concentration.

In the first region, the lower limit value of the variation in the film thickness of the SiC epitaxial layer may be 0.3% or 0.9%.

Moreover, the SiC epitaxial wafer 1 according to the present embodiment has preferably a warp of 90 μm or less, more preferably a warp of 75 μm or less, and even more preferably 50 μm or less. Additionally, the warp may be 30 μm or less, may be 20 μm or less, may be 15 μm or less, may be 10 μm or less, and may be 5 μm or less. The SiC epitaxial wafer 1 with a warp of 90 μm or less is advantageous in terms of conveyance to a process device and alignment accuracy.

A lower limit value of the warp may be 0 μm or 1.0 μm.

Figure 3:
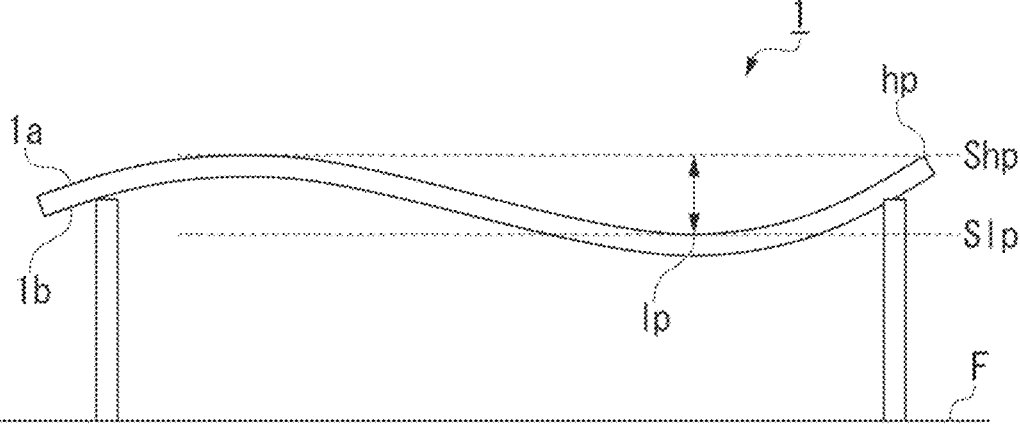
FIG. 3 is a diagram schematically showing a method of evaluating a shape of the SiC epitaxial wafer by warp.

FIG. 3 is a diagram schematically showing a method for evaluating the shape (deformation) of a SiC substrate by warp. The warp is a distance in a thickness direction between a highest point hp and a lowest point $1p$ of the first surface 1a. The first surface 1a is an outer surface of the SiC epitaxial layer 3. It is determined that the SiC epitaxial wafer 1 is deformed as the warp increases.

First, the SiC epitaxial wafer 1 is installed on three support points installed on the flat surface F. The support point is, for example, at a position overlapping a circumference within 7.5 mm from an outer peripheral end of the SiC epitaxial wafer 1. A virtual plane Slp parallel to the flat surface F through the lowest point $1p$ in the first surface 1a and a virtual plane Shp parallel to the flat surface F through the highest point hp in the first surface 1a are obtained. The warp is obtained as the distance in the height direction between the virtual plane Slp and the virtual plane Shp. The height direction is orthogonal to the flat surface F and is a direction away from the flat surface F.

In the SiC epitaxial wafer 1 according to the present embodiment, an absolute value of the bow is preferably 60 μm or less, and more preferably 45 μm or less. Additionally, the absolute value of the bow may be 30 μm or less, may be 20 μm or less, may be 15 μm or less, may be 10 μm or less, and may be 5 μm or less. The SiC epitaxial wafer 1 in which an absolute value of the bow is 60 μm or less can be properly focused on a processed surface even in fine lithography processes, and the SiC epitaxial wafer 1 can be processed with high precision.

A lower limit value of the bow may be 0.5 μm as the absolute value.

Figure 4:
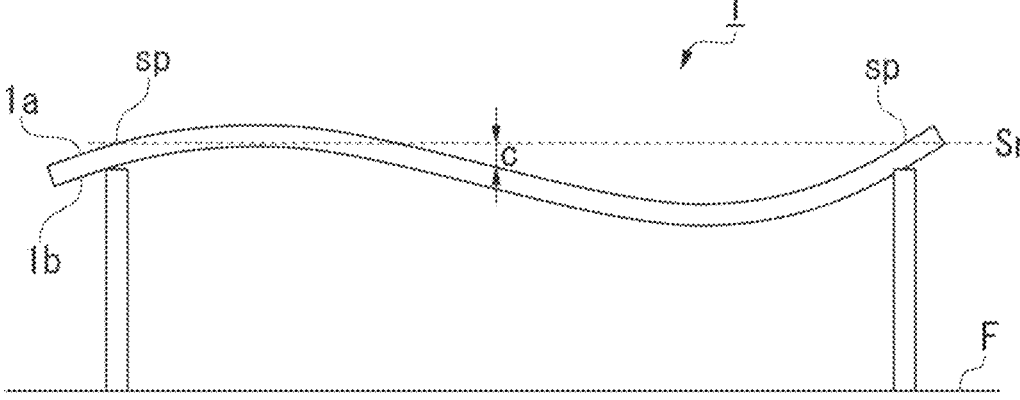
FIG. 4 is a diagram schematically showing a method of evaluating the shape of the SiC epitaxial wafer by bow.

FIG. 4 is a diagram schematically showing a method of evaluating the shape (deformation) of the SiC epitaxial wafer 1 by bow. The bow is a position of a center c of the SiC epitaxial wafer 1 in the height direction with respect to the reference plane Sr. In other words, the bow is a signed distance of the center c of the SiC epitaxial wafer 1 from the reference plane Sr. The reference plane Sr is a surface connecting points sp overlapping the three support points as seen in the thickness direction within the first surface 1a. The three support points are located at positions overlapping, for example, the circumference within 7.5 mm from the outer peripheral end of the SiC epitaxial wafer 1. Each of the three support points is at a three-fold symmetrical position with the center of the SiC epitaxial wafer 1 supported by the support point on the central axis. The reference plane Sr is, for example, a three-point reference plane. It is determined that the SiC epitaxial wafer 1 is deformed as the absolute value of the bow increases.

First, the SiC epitaxial wafer 1 is installed on three support points installed on the flat surface F. The three points sp of the first surface 1a located on the support point as seen from the thickness direction are connected and the reference plane Sr is obtained. Also, the reference plane Sr is set to 0, a direction away from the flat surface F with the reference plane Sr as the reference is defined as +, and a direction close to the flat surface F with the reference plane Sr as the reference is defined as −. The bow is obtained as a position in the height direction with respect to the reference plane Sr of the center c of the first surface 1a. In other words, the bow is obtained as a signed distance of the center c of the first surface 1a from the reference plane Sr.

In the SiC epitaxial wafer 1 according to the present embodiment, the SORI is preferably 60 μm or less, and more preferably 45 μm or less. Additionally, the SORI may be 30 μm or less, may be 25 μm or less, may be 20 μm or less, may be 10 μm or less, and may be 5 μm or less.

A lower limit value of the SORI may be 0 μm or 0.5 μm.

Figure 5:
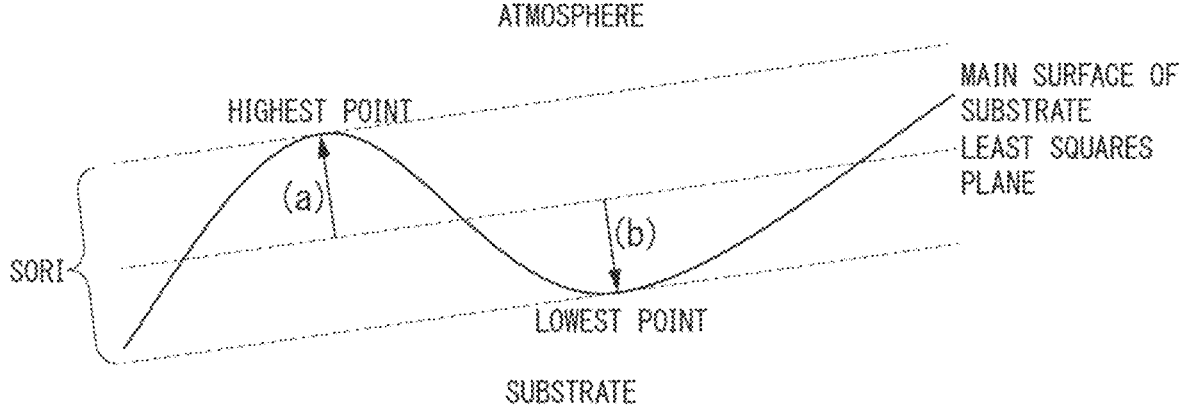
FIG. 5 is a conceptual diagram showing the definition of a SORI.

The SORI is one parameter indicating a degree of warpage of the substrate and is expressed as a sum of normal distances from a least squares plane, calculated by the least-squares method using all data on the substrate surface, to the highest and lowest points on the substrate surface when measurement has been performed so that the back surface of the substrate is supported and the original shape does not change. As shown in FIG. 5, when the least squares plane of the substrate surface is the reference height (the least squares plane height), a sum ((a)+(b)) of a distance (a) between the height at the highest point of the substrate surface and the reference height and a distance (b) between the height at the lowest point of the substrate surface and the reference height is expressed. Here, all data on the substrate surface is all data related to a relative height of the surface of the SiC epitaxial wafer 1 from the reference plane obtained using the interference fringe image of the laser light.

In the SiC epitaxial wafer 1 according to the present embodiment, a local thickness variation (LTV) in each of the plurality of unit exposure regions classified as 20 mm squares is preferably 4 $\mu$m or less, more preferably 3 $\mu$m or less, even more preferably 2.5 $\mu$m or less, and particularly preferably 2 $\mu$m or less. When the conditions are satisfied, the focus can be appropriately adjusted to the processed surface even in the fine lithography process, and the SiC epitaxial wafer 1 can be processed with high accuracy.

A lower limit value of the local thickness variation (LTV) may be 0.1 $\mu$m.

Figure 6:
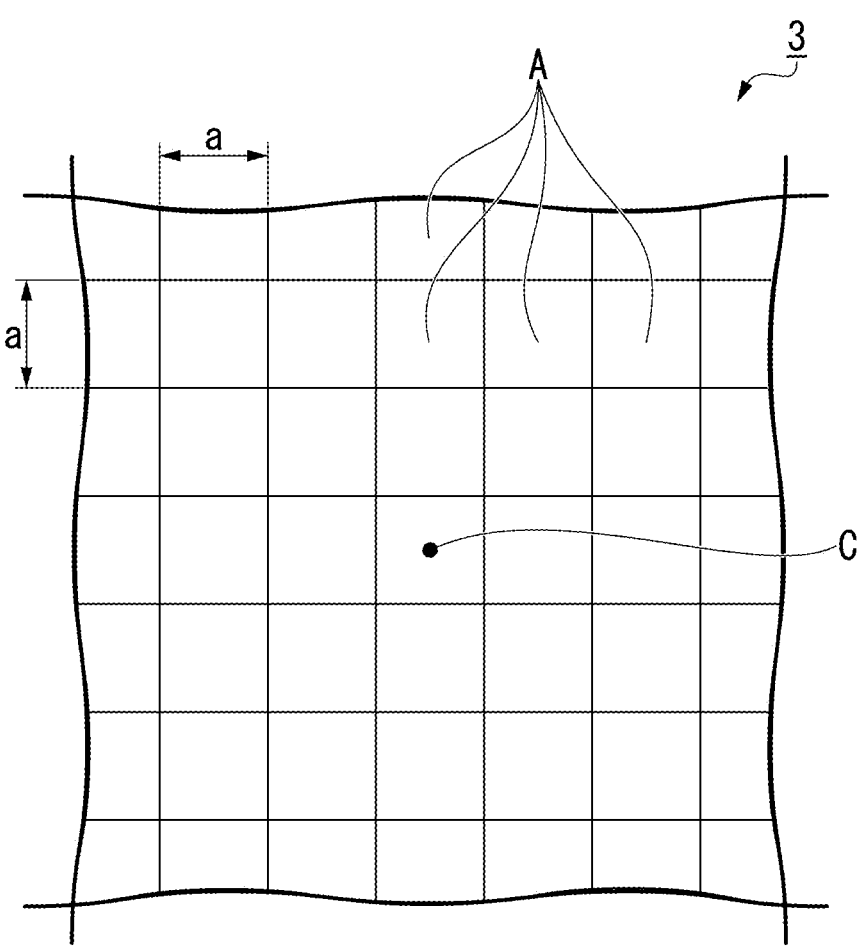
FIG. 6 is a diagram showing a unit exposure region.

FIG. 6 is a diagram showing a unit exposure region A. The unit exposure region A is each of a plurality of regions classified as squares having a side length a in the planar view in the stacking direction of the SiC epitaxial wafer 1 (a <0001> direction). The unit exposure regions A are laid on the surface of the SiC epitaxial wafer 1 without any gaps. The center of one of the plurality of unit exposure regions A coincides with the center C of the SiC epitaxial wafer 1. For example, in the measurement of the LTV, the side length a of the unit exposure region A is set to 20 mm. The LTV, which is a distance difference between the highest point and the lowest point, is obtained by measuring the highest point and the lowest point in the site surrounded by the unit exposure regions A when the SiC epitaxial wafer 1 is adsorbed on a vacuum chuck.

In the SiC epitaxial wafer 1 according to the present embodiment, a site flatness (SFQR) in each of the plurality of unit exposure regions classified as 20 mm squares is preferably 2 $\mu$m or less, more preferably 1.5 $\mu$m or less, and even more preferably 1 $\mu$m or less.

A lower limit value of site flatness (SFQR) may be 0 $\mu$m or 0.05 $\mu$m.

The SFQR is expressed as a sum of normal distances from a least-squares plane, calculated by the least-squares method using all data in the site surrounded by the unit exposure regions A when the SiC epitaxial wafer 1 is adsorbed on a vacuum chuck, to the highest and lowest points on the substrate surface. The SFQR is different from the SORI in that it is a measurement result at a specific site. For example, in the measurement of the SFQR, the side length a of the unit exposure region A is 20 mm. Here, all data of the site surrounded by the unit exposure regions A is all data related to a relative height of the surface of the SiC epitaxial wafer 1 from the reference plane.

Next, a method of manufacturing the SiC epitaxial wafer 1 according to the present embodiment will be described.

Figure 7:
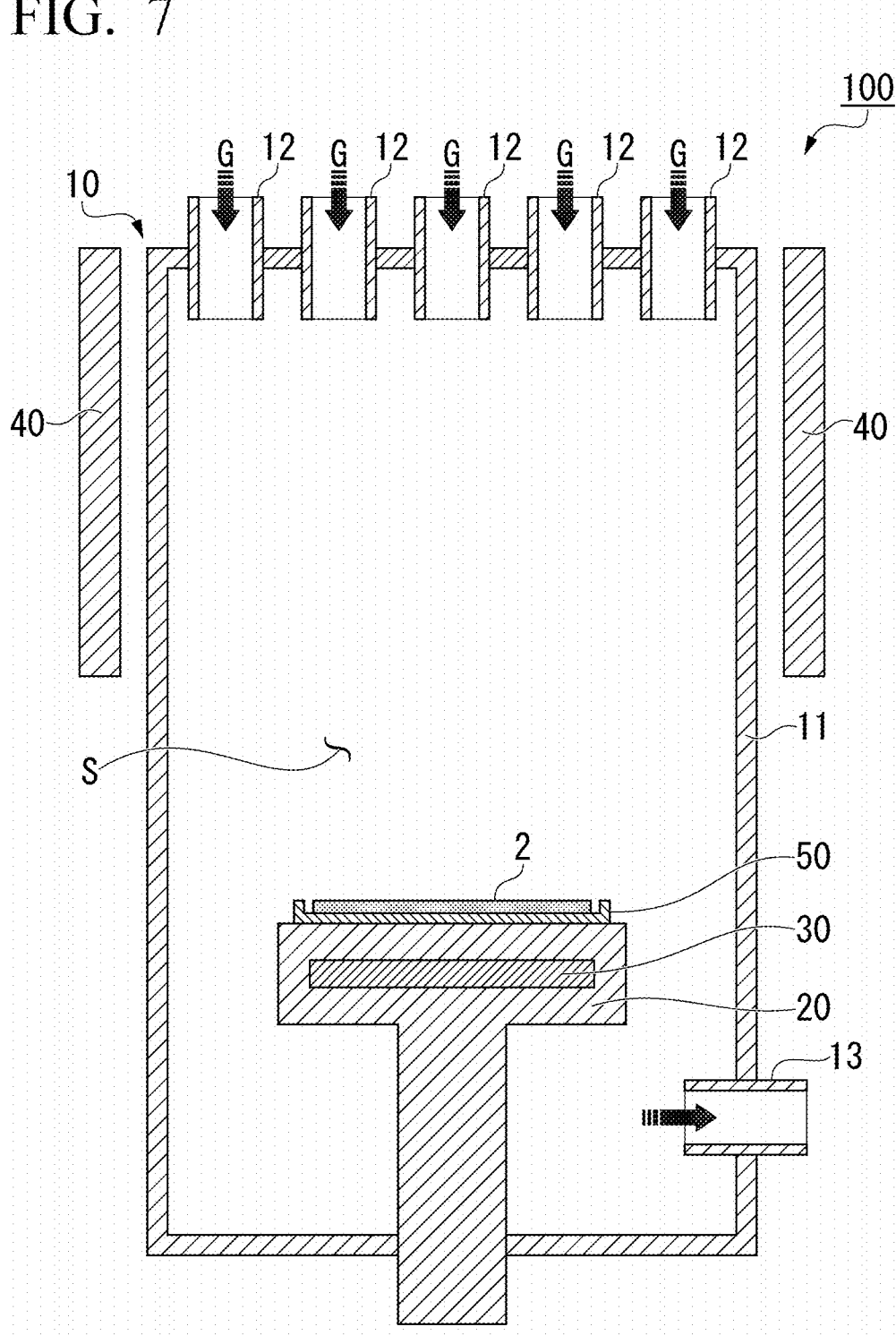
FIG. 7 is a cross-sectional view of a manufacturing device for the SiC epitaxial wafers according to the present embodiment.

FIG. 7 is a cross-sectional schematic diagram of an example of a film formation device for a SiC epitaxial wafer according to the present embodiment. The film formation device 100 includes, for example, a chamber 10, a support 20, a lower heater 30, and an upper heater 40. The SiC substrate 2 is placed on a susceptor 50 and transported into a film formation device.

The support 20 supports the susceptor 50. The support 20, for example, can be rotated about an axis. The SiC substrate 2 is arranged on the support 20, for example, in a state in which the SiC substrate 2 is placed on the susceptor 50. The lower heater 30, for example, is in the support 20 and heats the SiC substrate 2. The upper heater 40 heats the upper part of the chamber 10.

The chamber 10 includes, for example, a main body 11, a gas supply port 12, and a gas exhaust port 13. The main body 11 surrounds a film formation space S. The gas supply port 12 is an inlet for supplying gas G to the film formation space S. The plurality of gas supply ports 12, for example, are located above a placement surface of the SiC substrate 2. The film formation device in which the gas supply port 12 is located above the placement surface of the SiC substrate 2 is referred to as a vertical furnace. The gas exhaust port 13 is an outlet for exhausting gas G or the like accumulated in the film formation space S. The gas exhaust port 13, for example, is located below the placement surface of the SiC substrate 2.

The gas G is, for example, a source gas, a carrier gas, a dopant gas, and an etching gas. The source gas includes a Si-based source gas and a C-based source gas.

The Si-based source gas is a source gas containing Si in the molecule. Examples of the Si-based source gas include silane ($SiH_4$), dichlorosilane ($SiH_2Cl_2$), trichlorosilane ($SiHCl_3$), tetrachlorosilane ($SiCl_4$), and the like. The Si-based source gas preferably includes at least one selected from the group consisting of, for example, $SiH_3Cl$, $SiH_2Cl_2$, and $SiHCl_3$.

The C-based source gas is a source gas containing C in the molecule. Examples of the C-based source gas are propane ($C_3H_8$) and ethylene ($C_2H_4$). The C-based source gas preferably includes, for example, at least one selected from the group consisting of $CH_4$, $C_2H_6$, and $C_3H_8$.

A dopant gas is a gas containing a carrier element. The dopant gas preferably contains, for example, at least one of nitrogen ($N_2$) and ammonia ($NH_3$).

The carrier gas is a gas that conveys the source gas to the SiC substrate 2, and is a gas that is inert to SiC. The carrier gas preferably contains, for example, Ar.

An etching gas is a gas that reacts with SiC at a high temperature and has the action of etching SiC. The etching gas is preferably, for example, hydrogen chloride (HCl).

Figure 8:
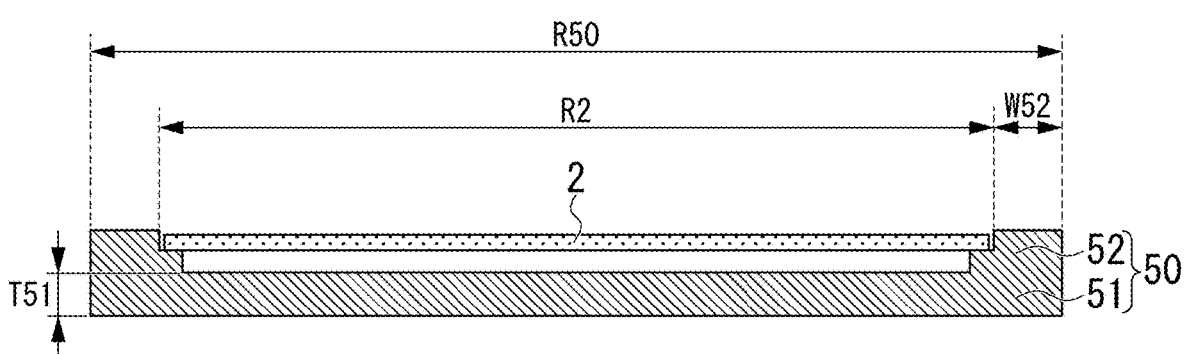
FIG. 8 is a cross-sectional view of a state in which a SiC substrate is placed on a susceptor.

The susceptor 50 supports the SiC substrate 2. FIG. 8 is a cross-sectional view of a state in which the SiC substrate 2 is placed on the susceptor 50. The susceptor 50 has a main body 51 and a frame 52 protruding from the main body 51. The frame 52 prevents the SiC substrate 2 rotating during film formation from popping outward.

A diameter R50 of the susceptor 50 is 102.5% or more and 115% or less of the diameter R2 of the SiC substrate 2. By making the size of the susceptor 50 close to the size of the SiC substrate 2, the susceptor 50 is bent along the SiC substrate 2 bent during epitaxial growth. When the SiC substrate 2 is bent, the distance between the SiC substrate 2 and the susceptor 50 is not significantly changed, so that the uniformity of the carrier concentration of the SiC epitaxial layer 3 formed on the SiC substrate 2 can be increased.

A thickness T51 of the main body 51 of the susceptor 50 is set to 1 mm or more and 4 mm or less. The main body 51 is a portion facing the SiC substrate 2. The thickness T51 of the main body 51 has a significant influence on the curvature of the susceptor 50. Because the thickness T51 of the main body 51 is thin, when the SiC substrate 2 is bent, the susceptor 50 can be bent following the SiC substrate 2.

Moreover, a radial width W52 of the frame 52 of the susceptor 50 is, for example, 10 mm or less. By narrowing the width W52, the entire susceptor 50 is more likely to be bent.

In the film formation step, the SiC epitaxial layer 3 is formed on the SiC substrate 2. The SiC epitaxial layer is formed by supplying a mixed gas including a Si-based source gas, a C-based source gas, an etching gas, a carrier gas, and a dopant gas to one surface of the SiC substrate 2. When these mixed gases are supplied, it is preferable that a carrier gas with a heavy molecular weight be locally unevenly distributed and exhausted from some gas supply ports 12 among the plurality of gas supply ports 12. Hereinafter, the gas supply port 12 from which the carrier gas with the heavy molecular weight is exhausted is referred to as a first gas supply port.

A carrier gas with a heavy molecular weight is a gas with a molecular weight of 28 or more, and is, for example, Ar. A process of locally unevenly distributing and exhausting a gas with a heavy molecular weight is implemented by combining first gas supply ports among the plurality of gas supply ports 12 within a certain range. The first gas supply ports among the plurality of gas supply ports 12 are arranged in the central portion.

An area of a portion to which the first gas supply ports belong is set to 0.3% or more and 2.5% or less of an area of a top plate of the chamber 10. The area of the portion to which the first gas supply ports belong is an area surrounded by a line connecting first gas supply ports located at outermost positions. Moreover, a total supply port area of the first gas supply ports is set to 10% or more and 30% or less of a total supply port area of the plurality of gas supply ports 12.

A flow rate of a gas with a heavy molecular weight supplied from the first gas supply port is set to 1000 sccm or more and 4000 sccm or less.

When a carrier gas with a heavy molecular weight is unevenly distributed and supplied at a predetermined flow rate, a gas G is convected in the film formation space S. Although the gas G passes from the gas supply port 12 to the surface of the SiC substrate 2 and forms a flow toward the gas exhaust port 13 in general, a variation in a carrier concentration of the SiC epitaxial layer 3 can be suppressed by deliberately allowing the gas G to convect. Moreover, it is possible to suppress the variation in the film thickness of the SiC epitaxial layer 3 by convection of the gas G.

As described above, the flow of the gas G in the film formation space S is controlled using a predetermined susceptor 50, such that the SiC epitaxial wafer 1 with a large diameter, a thin thickness, and high carrier concentration uniformity can be obtained.

The SiC epitaxial wafer 1 according to the present embodiment has a thin thickness and high carrier density uniformity in the plane despite the large diameter. Therefore, the SiC epitaxial wafer 1 according to the present embodiment has a high yield of a SiC device. Moreover, the SiC device produced from the SiC epitaxial wafer 1 according to the present embodiment has low resistance and low loss during operation.

Although modes for carrying out the present invention have been described using embodiments, the present invention is not limited to the embodiments and various modifications and substitutions can also be made without departing from the scope and spirit of the present invention.

INVENTIVE EXAMPLE

Inventive Example 1

First, a 4H—SiC substrate having a diameter of 203 mm and a thickness of 363 μm was provided and housed inside a vertical furnace as shown in FIG. 7. The SiC substrate 2 was placed on the susceptor 50 and housed in the chamber 10 together with the susceptor 50. In the susceptor 50, a diameter was 230 mm, a thickness of the main body was 3 mm, and a radial width of the frame was 10 mm.

Next, a SiC epitaxial layer 3 having a thickness of 11 μm was formed on the SiC substrate 2. The film formation conditions during the formation of the SiC epitaxial layer 3 were as follows. The carrier gas was Ar.

A ratio of the area of the part belonging to the carrier gas supply port (first gas supply port) to the top plate of the chamber: 2%

A ratio of the area of the carrier gas supply ports (the first gas supply ports) to all gas supply ports: 20%

A flow rate of the carrier gas was 1000 sccm or more and 4000 sccm or less.

The variation in the carrier concentration and the variation in film thickness in the SiC epitaxial wafer produced under the above-described conditions were measured.

The carrier concentration was measured using the Hg—CV method. The measurement points were a center and positions of ±20 mm, ±40 mm, ±60 mm, ±80 mm, and ±95 mm from the center along the straight line L extending in the <11-20> direction with the center as the reference. The variation in the carrier concentration was found from the carrier concentration at each measurement point. Moreover, the variation in the carrier concentration in the first region was also measured. The carrier concentration of the first region was measured at points of ±60 mm, ±80 mm, and ±95 mm from the center along a straight line extending in the <11-20> direction with the center C as the reference and points of ±60 mm, ±80 mm, ±95 nm, and −90 mm from the center along a straight line extending in the <−1100> direction with the center C as the reference.

The variation in the film thickness was measured by infrared spectroscopy. The variation in the film thickness was also measured in the first region. The measurement point of the variation in the film thickness was the same as the measurement point of the carrier concentration.

The variation in the carrier concentration of the SiC epitaxial wafer of inventive example 1 was 5.0%. Moreover, the variation in the carrier concentration in the first region of the SiC epitaxial wafer of inventive example 1 was 5.1%. Moreover, the variation in the film thickness of the SiC epitaxial layer of the SiC epitaxial wafer of inventive example 1 was 2.6%. Moreover, the variation in the film thickness of the epitaxial layer in the first region of the SiC epitaxial wafer of inventive example 1 was 1.9%.

Inventive Example 2

First, a 4H—SiC substrate having a diameter of 200 mm and a thickness of 372 μm was provided and housed inside a vertical furnace as shown in FIG. 7. The SiC substrate 2 was placed on the susceptor 50 and housed in the chamber 10 together with the susceptor 50. In the susceptor 50, a diameter was 230 mm, a thickness of the main body was 3 mm, and a radial width of the frame was 10 mm.

Next, a SiC epitaxial layer 3 having a thickness of 14 μm was formed on the SiC substrate 2. The film formation conditions during the formation of the SiC epitaxial layer 3 were as follows. The carrier gas was Ar.

A ratio of the area of the part belonging to the carrier gas supply port (first gas supply port) to the top plate of the chamber: 1.5%

A ratio of the area of the carrier gas supply ports (the first gas supply ports) to all gas supply ports: 20%

A flow rate of the carrier gas was 1000 sccm or more and 4000 sccm or less.

In the SiC epitaxial wafer produced under the above conditions, the variation in the carrier concentration and the variation in film thickness were measured in the same manner as in Inventive example 1. Furthermore, the variation in the carrier concentration in the first region and the variation in the film thickness in the first region were measured in the same manner as in Inventive example 1.

The LTV of the SiC epitaxial wafer, the SFQR of the SiC epitaxial wafer, the SORI of the SiC epitaxial wafer, the warp of the SiC epitaxial wafer, and the bow of the SiC epitaxial wafer were obtained by using Ultrasort II manufactured by Corning Tropel.

The variation in the carrier concentration of the SiC epitaxial wafer of inventive example 2 was 13.6%. Moreover, the variation in the carrier concentration in the first region of the SiC epitaxial wafer of inventive example 2 was 13.1%. Moreover, the variation in the film thickness of the SiC epitaxial layer of the SiC epitaxial wafer of inventive example 2 was 5.8%. Moreover, the variation in the film thickness of the epitaxial layer in the first region of the SiC epitaxial wafer of inventive example 2 was 5.8%.

The LTV of the SiC epitaxial wafer of inventive example 2 was 3.8 μm. The SFQR of the SiC epitaxial wafer of inventive example 2 was 1.7 μm. The SORI of the SiC epitaxial wafer of inventive example 2 was 23.4 μm. The warp of the SiC epitaxial wafer of inventive example 2 was 31.7 μm. The bow of the SiC epitaxial wafer of inventive example 2 was-10 μm.

Inventive Example 3

First, a 4H—SiC substrate having a diameter of 200 mm and a thickness of 371 μm was provided and housed inside a vertical furnace as shown in FIG. 7. The SiC substrate 2 was placed on the susceptor 50 and housed in the chamber 10 together with the susceptor 50. In the susceptor 50, a diameter was 230 mm, a thickness of the main body was 3 mm, and a radial width of the frame was 10 mm.

Next, a SiC epitaxial layer 3 having a thickness of 11 μm was formed on the SiC substrate 2. The film formation conditions during the formation of the SiC epitaxial layer 3 were as follows. The carrier gas was Ar.

A ratio of the area of the part belonging to the carrier gas supply port (first gas supply port) to the top plate of the chamber: 1.5%

A ratio of the area of the carrier gas supply ports (the first gas supply ports) to all gas supply ports: 30%

A flow rate of the carrier gas was 1000 sccm or more and 4000 sccm or less.

In the SiC epitaxial wafer produced under the above conditions, the variation in the carrier concentration and the variation in film thickness were measured in the same manner as in Inventive example 1. Furthermore, the variation in the carrier concentration in the first region and the variation in the film thickness in the first region were measured in the same manner as in Inventive example 1.

The LTV, the SFQR, the SORI, the warp, and the bow of the SiC epitaxial wafer of inventive example 3 were obtained by the same manner as in Inventive example 2.

The variation in the carrier concentration of the SiC epitaxial wafer of inventive example 3 was 18.2%. Moreover, the variation in the carrier concentration in the first region of the SiC epitaxial wafer of inventive example 3 was 18.4%. Moreover, the variation in the film thickness of the SiC epitaxial layer of the SiC epitaxial wafer of inventive example 3 was 5.7%. Moreover, the variation in the film thickness of the epitaxial layer in the first region of the SiC epitaxial wafer of inventive example 3 was 2.6%.

The LTV of the SiC epitaxial wafer of inventive example 3 was 1.9 μm. The SFQR of the SiC epitaxial wafer of inventive example 3 was 0.9 μm. The SORI of the SiC epitaxial wafer of inventive example 3 was 11.1 μm. The warp of the SiC epitaxial wafer of inventive example 3 was 13.8 μm. The bow of the SiC epitaxial wafer of inventive example 3 was –0.7 μm.

Inventive Example 4

First, a 4H—SiC substrate having a diameter of 200 mm and a thickness of 368 μm was provided and housed inside a vertical furnace as shown in FIG. 7. The SiC substrate 2 was placed on the susceptor 50 and housed in the chamber 10 together with the susceptor 50. In the susceptor 50, a diameter was 230 mm, a thickness of the main body was 3 mm, and a radial width of the frame was 10 mm.

Next, a SiC epitaxial layer 3 having a thickness of 11 μm was formed on the SiC substrate 2. The film formation conditions during the formation of the SiC epitaxial layer 3 were as follows. The carrier gas was Ar.

A ratio of the area of the part belonging to the carrier gas supply port (first gas supply port) to the top plate of the chamber: 2.5%

A ratio of the area of the carrier gas supply ports (the first gas supply ports) to all gas supply ports: 20%

A flow rate of the carrier gas was 1000 sccm or more and 4000 sccm or less.

In the SiC epitaxial wafer produced under the above conditions, the variation in the carrier concentration and the variation in film thickness were measured in the same manner as in Inventive example 1. Furthermore, the variation in the carrier concentration in the first region and the variation in the film thickness in the first region were measured in the same manner as in Inventive example 1.

The LTV, the SFQR, the SORI, the warp, and the bow of the SiC epitaxial wafer of inventive example 4 were obtained by the same manner as in Inventive example 2.

The variation in the carrier concentration of the SiC epitaxial wafer of inventive example 4 was 8.8%. Moreover, the variation in the carrier concentration in the first region of the SiC epitaxial wafer of inventive example 4 was 8.6%. Moreover, the variation in the film thickness of the SiC epitaxial layer of the SiC epitaxial wafer of inventive example 4 was 4.2%. Moreover, the variation in the film thickness of the epitaxial layer in the first region of the SiC epitaxial wafer of inventive example 4 was 2.0%.

The LTV of the SiC epitaxial wafer of inventive example 4 was 1.9 μm. The SFQR of the SiC epitaxial wafer of inventive example 4 was 0.8 μm. The SORI of the SiC epitaxial wafer of inventive example 4 was 15.5 μm. The warp of the SiC epitaxial wafer of inventive example 4 was 19.3 μm. The bow of the SiC epitaxial wafer of inventive example 4 was –4.0 μm.

Inventive Example 5

First, a 4H—SiC substrate having a diameter of 203 mm and a thickness of 380 μm was provided and housed inside a vertical furnace as shown in FIG. 7. The SiC substrate 2 was placed on the susceptor 50 and housed in the chamber 10 together with the susceptor 50. In the susceptor 50, a diameter was 230 mm, a thickness of the main body was 3 mm, and a radial width of the frame was 10 mm.

Next, a SiC epitaxial layer 3 having a thickness of 11 μm was formed on the SiC substrate 2. The film formation conditions during the formation of the SiC epitaxial layer 3 were as follows. The carrier gas was Ar.

A ratio of the area of the part belonging to the carrier gas supply port (first gas supply port) to the top plate of the chamber: 2.5%

A ratio of the area of the carrier gas supply ports (the first gas supply ports) to all gas supply ports: 30%

A flow rate of the carrier gas was 1000 sccm or more and 4000 sccm or less.

In the SiC epitaxial wafer produced under the above conditions, the variation in the carrier concentration and the variation in film thickness were measured in the same manner as in Inventive example 1. Furthermore, the variation in the carrier concentration in the first region and the variation in the film thickness in the first region were measured in the same manner as in Inventive example 1.

The LTV, the SFQR, the SORI, the warp, and the bow of the SiC epitaxial wafer of inventive example 5 were obtained by the same manner as in Inventive example 1.

The variation in the carrier concentration of the SiC epitaxial wafer of inventive example 5 was 6.5%. Moreover, the variation in the carrier concentration in the first region of the SiC epitaxial wafer of inventive example 5 was 4.8%. Moreover, the variation in the film thickness of the SiC epitaxial layer of the SiC epitaxial wafer of inventive example 5 was 5.0%. Moreover, the variation in the film thickness of the epitaxial layer in the first region of the SiC epitaxial wafer of inventive example 5 was 3.7%.

The LTV of the SiC epitaxial wafer of inventive example 5 was 2.0 μm. The SFQR of the SiC epitaxial wafer of inventive example 5 was 1.1 μm. The SORI of the SiC epitaxial wafer of inventive example 5 was 6.6 μm. The warp of the SiC epitaxial wafer of inventive example 5 was 6.2 μm. The bow of the SiC epitaxial wafer of inventive example 5 was −1.7 μm.

Comparative Example 1

In comparative example 1, a susceptor in which a diameter was 250 mm, a thickness of the main body portion was 8 mm, and a radial width of a frame was 20 mm was used, and an area ratio of a portion to which the carrier gas supply ports (first gas supply ports) belonged to the top plate of the chamber was 42%, and an area ratio of the carrier gas supply ports to all gas supply ports was 71%. Moreover, the flow rate of the carrier gas in comparative example 1 was less than the flow rate in comparative example 1 and was less than 1000 sccm.

Other conditions were the same as those of inventive example 1 and the variation in the carrier concentration of the SiC epitaxial wafer of comparative example 1 and the variation in film thickness were measured.

The variation in the carrier concentration of the SiC epitaxial wafer of comparative example 1 was 26.1%. Moreover, the variation in the carrier concentration in the first region of the SiC epitaxial wafer of comparative example 1 was 25.9%. Moreover, the variation in the film thickness of the SiC epitaxial layer of the SiC epitaxial wafer of comparative example 1 was 5.3%. Moreover, the variation in the film thickness of the epitaxial layer in the first region of the SiC epitaxial wafer of comparative example 1 was 5.3%.

EXPLANATION OF REFERENCES

1 SiC epitaxial wafer
2 SiC substrate
3 SiC epitaxial layer
4 Notch
10 Chamber
11 Main body
12 Gas supply port
13 Gas exhaust port
20 Support
30 Lower heater
40 Upper Heater
50 Susceptor
51 Main body
52 Frame
A Unit exposure region

What is claimed is:

1. A SiC epitaxial wafer comprising:
a SiC substrate; and
a SiC epitaxial layer,
wherein the SiC substrate has a diameter of 195 mm or more and a thickness of 460 μm or less, and
wherein the SiC epitaxial layer has a carrier concentration variation of 20% or less.

2. The SiC epitaxial wafer according to claim 1, wherein a local thickness variation (LTV) in each of a plurality of unit exposure regions classified as 20 mm squares is 4 μm or less in a planar view in a stacking direction of the SiC epitaxial wafer.

3. The SiC epitaxial wafer according to claim 1, wherein site flatness (site flatness, front reference surface, least-squares best-fit reference plane, range (SFQR)) in each of a plurality of unit exposure regions classified as 20 mm squares is 2 μm or less in a planar view in a stacking direction of the SiC epitaxial wafer.

4. The SiC epitaxial wafer according to claim 1, wherein warp is 90 μm or less.

5. The SiC epitaxial wafer according to claim 1, wherein bow is 60 μm or less when a surface connecting a support point overlapping a circumference within 7.5 mm from an outermost circumference and an overlapping portion as seen in a thickness direction is used as a reference surface.

6. The SiC epitaxial wafer according to claim 1, wherein SORI is 60 μm or less.

7. The SiC epitaxial wafer according to claim 1, wherein the SiC epitaxial layer has a carrier concentration variation of 20% or less in a first region at a distance of 60 mm or more and 95 mm or less from a center of the SiC epitaxial layer in a planar view in a stacking direction of the SiC epitaxial layer.

8. The SiC epitaxial wafer according to claim 1, wherein a variation in a film thickness of the SiC epitaxial layer is 5% or less.

9. The SiC epitaxial wafer according to claim 8, wherein the SiC epitaxial layer has the film thickness variation of 5% or less in a first region at a distance of 60 mm or more and 95 mm or less from a center of the SiC epitaxial layer in a planar view in a stacking direction of the SiC epitaxial layer.

* * * * *